United States Patent
Engelbart et al.

(10) Patent No.: US 10,139,808 B2
(45) Date of Patent: Nov. 27, 2018

(54) PREDICTIVE SHIMMING OF JOINTS

(71) Applicant: The Boeing Company, Chicago, IL (US)

(72) Inventors: Roger W. Engelbart, St. Louis, MO (US); George E. Bible, Chesterfield, MO (US); James Leonard Scherer, St. Peters, MO (US); Brian Stutzman, Florissant, MO (US); Jeffrey J. Kilwin, St. Peters, MO (US); Christopher M. Vaccaro, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 46 days.

(21) Appl. No.: 15/258,271

(22) Filed: Sep. 7, 2016

(65) Prior Publication Data

US 2018/0067476 A1 Mar. 8, 2018

(51) Int. Cl.
*G05B 19/4099* (2006.01)
*B33Y 10/00* (2015.01)
(Continued)

(52) U.S. Cl.
CPC ...... *G05B 19/4099* (2013.01); *B29C 67/0088* (2013.01); *B33Y 10/00* (2014.12);
(Continued)

(58) Field of Classification Search
CPC ......... Y10T 29/49764; Y10T 29/49769; Y10T 29/49771; Y10T 29/49774; Y10T 29/4978;
(Continued)

(56) References Cited

U.S. PATENT DOCUMENTS

| 4,848,137 A | 7/1989 | Turner et al. |
| 6,618,505 B2 | 9/2003 | Cork et al. |

(Continued)

FOREIGN PATENT DOCUMENTS

| WO | 0166414 A1 | 9/2001 |
| WO | 2014186089 A1 | 11/2014 |

OTHER PUBLICATIONS

Dalin et al, "Measurement of the Thickness of U-30MES-5NT and VGM-L Sealing Compound Layers in Aircraft Products Using the Ultrasonic Nondestructive Testing Method", Polymer Science, Series D. Glues and Sealing Materials, 2012, vol. 5, No. 4, pp. 305-308.
(Continued)

*Primary Examiner* — Jermie Cozart
(74) *Attorney, Agent, or Firm* — Kolisch Hartwell, P.C.

(57) ABSTRACT

A method and a system are provided for predicting and creating a shim for use in a joint where two parts, such as a skin and a substructure, are assembled together. Digital models for the skin and the substructure may be used as nominal maps of the outlines and profiles of the parts. The skin may be inspected, e.g., by nondestructive means, such as ultrasound, to determine as-built thickness profile for comparison to the skin's digital model of the thickness profile. Mating areas of the skin and substructure may be determined from their digital models of their outlines. Deviations in the mating areas of the as-built thickness of the skin from the digital model of the skin may be used to generate a digital model of a shim. The shim may be constructed from its digital model by additive manufacturing techniques that may involving machining or 3D printing.

20 Claims, 8 Drawing Sheets

(51) Int. Cl.
*B33Y 50/02* (2015.01)
*B33Y 80/00* (2015.01)
*B29C 67/00* (2017.01)
*B64F 5/00* (2017.01)
*G06F 17/50* (2006.01)
*B64F 5/10* (2017.01)
*B29L 31/30* (2006.01)

(52) U.S. Cl.
CPC ............ *B33Y 50/02* (2014.12); *B33Y 80/00* (2014.12); *B64F 5/00* (2013.01); *G06F 17/5086* (2013.01); *G06F 17/5095* (2013.01); *B29L 2031/3076* (2013.01); *B64F 5/10* (2017.01); *G05B 2219/35134* (2013.01); *G05B 2219/49007* (2013.01); *Y10T 29/4978* (2015.01); *Y10T 29/49764* (2015.01); *Y10T 29/49769* (2015.01); *Y10T 29/49771* (2015.01); *Y10T 29/49774* (2015.01)

(58) Field of Classification Search
CPC ......... B33Y 10/00; B33Y 80/00; B33Y 50/00; B33Y 50/02; B64F 5/10; G06F 17/5086; G06F 17/5095; G05B 19/4099
See application file for complete search history.

(56) References Cited

U.S. PATENT DOCUMENTS

| | | |
|---|---|---|
| 7,626,692 B2 | 12/2009 | Engelbart et al. |
| 7,730,789 B2 | 6/2010 | Odendahl |
| 8,094,921 B2 | 1/2012 | Engelbart et al. |
| 8,583,271 B2 | 11/2013 | Engelbart et al. |
| 8,687,872 B2 | 4/2014 | Engelbart et al. |
| 8,756,792 B2 | 6/2014 | Boyl-Davis et al. |
| 8,813,382 B1 | 8/2014 | Buttrick |
| 9,082,209 B1 | 7/2015 | Engelbart |
| 9,214,018 B1 | 12/2015 | Engelbart |
| 9,429,935 B2* | 8/2016 | Boyl-Davis ...... G05B 19/40931 |
| 2009/0100791 A1 | 4/2009 | Kayani et al. |
| 2012/0316666 A1* | 12/2012 | Boyl-Davis ...... G05B 19/40931 700/98 |
| 2015/0254835 A1 | 9/2015 | Dorris et al. |
| 2015/0276376 A1 | 10/2015 | Lagally et al. |
| 2016/0097728 A1 | 4/2016 | Engelbart et al. |
| 2017/0138385 A1* | 5/2017 | Clark ................ G05B 19/4099 |

OTHER PUBLICATIONS

European Patent Office, Extended European Search Report regarding European Patent Application No. 17189438.9-1224, dated Jan. 24, 2018, 10 pages.

* cited by examiner

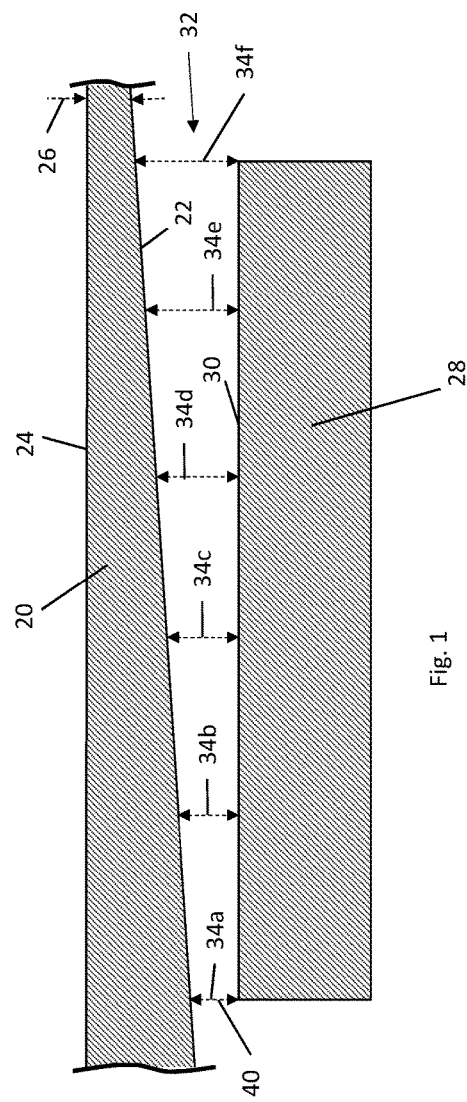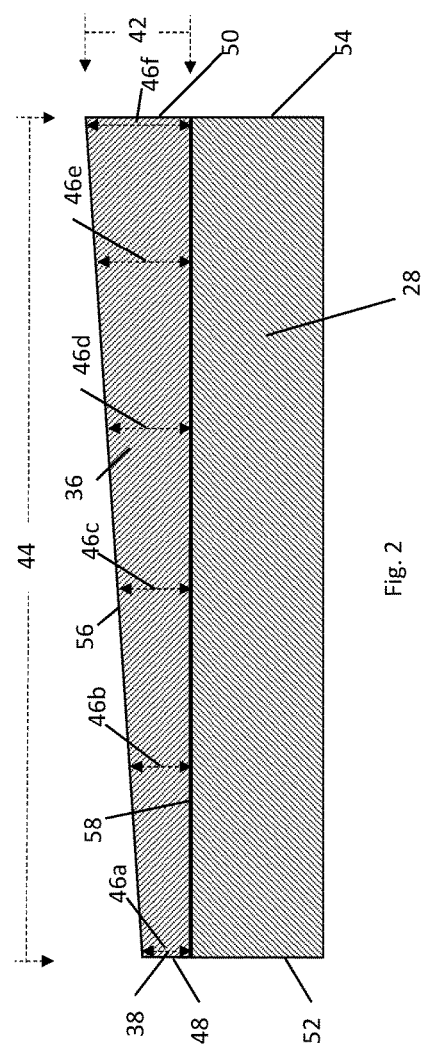

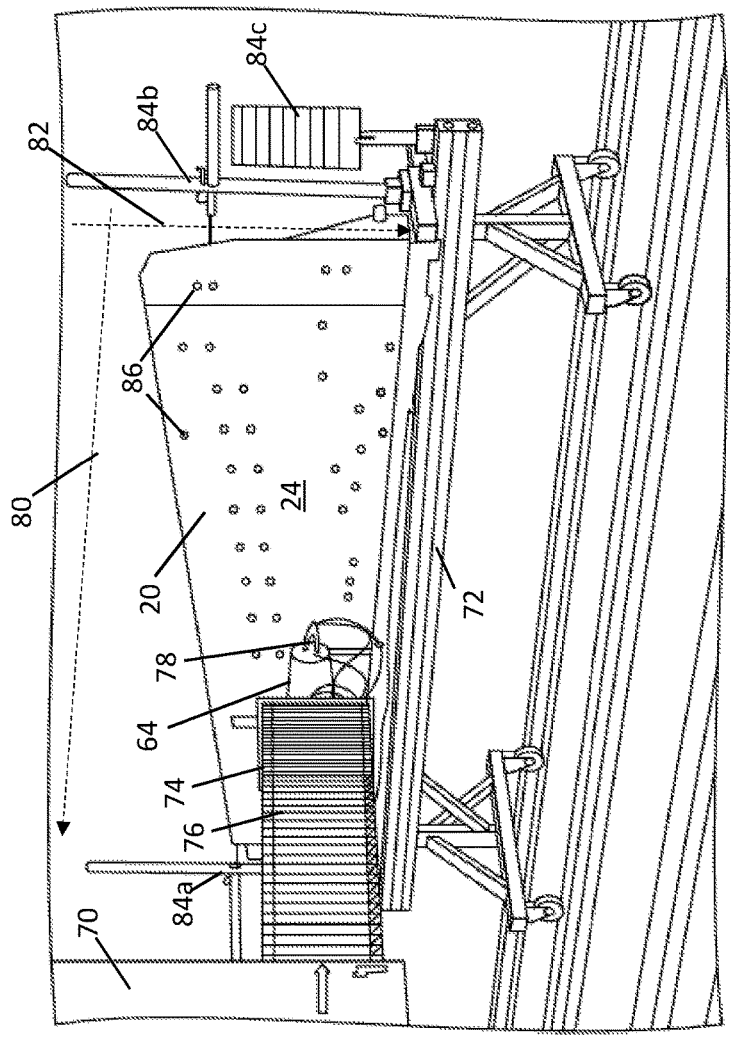
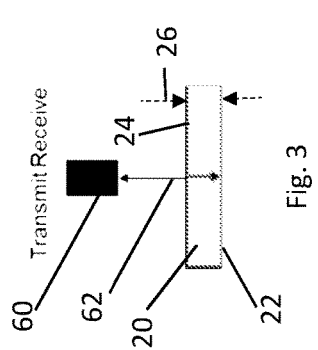
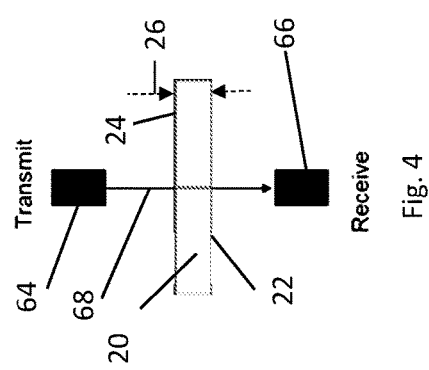

PREDICTIVE SHIMMING OF JOINTS

FIELD

This disclosure relates to techniques for gathering and using data from nondestructive inspection of parts for use in assembling the parts. More specifically, the disclosed embodiments relate to systems and methods for using the data to determine the size and shape of a shim to fill gaps in a joint between part surfaces.

INTRODUCTION

Parts may be manufactured for assembly from composite materials or metallic materials and either of these types of parts may be subjected to nondestructive inspection prior to assembly. Nondestructive inspection methods include the use of ultrasonics, eddy current, x-ray, magnetic resonance, optical imaging, and microwave.

Typically, the nondestructive inspection is performed to characterize qualities of the parts. For example, a part made of a composite material, such as carbon-fiber-reinforced polymer, may have delaminations where adjacent layers of carbon fiber separate from one another, the extent and effect of which may be characterized by inspection. Parts may include unintended voids in the structure which may create a degree of porosity that may be measured and located. Nondestructive inspection, such as ultrasound inspection, will typically gather data about the part in the course of detecting and locating such characteristics.

Proper assembly of parts, for example mounting an aerodynamic (or aero) surface or skin to a substructure, such as a spar or rib, requires fitting the parts together at mating surfaces within predetermined limits, for example, not leaving any gap between the mating surfaces greater than a predetermined allowance. A gap greater than the predetermined allowance may be filled with a shim for reasons of aerodynamic performance and structural integrity.

Determining the necessity and size and shape of shims may require a labor-intensive, iterative process following the fabrication and nondestructive testing of the parts. Parts may be temporarily assembled and then visually inspected and measured for gaps between the skin and substructure. The parts may then be dismantled and a trial shim fabricated. The parts may then be reassembled with the shim temporarily secured in place, to check the fit. This is a second temporary assembly operation and such operations may need to be repeated until the shim fit is satisfactory.

Accordingly, there is a need for a method and a system for making use of information obtained from nondestructive inspection of parts in combination with digital models of the parts for determining the dimensions of shims and constructing such shims without the need for time-consuming iterative processes that impact production flow and require significant touch labor.

SUMMARY

The present disclosure provides methods and systems for predicting a set of dimension data for a shim to be used at a joint between parts, and may include manufacture of the shim and installation of the shim in the joint. In some embodiments, a method for creating a shim for use in mounting a skin to a substructure may include nondestructively inspecting the skin at a plurality of locations of the skin surfaces to gather a data set relating to the skin thickness. The method may include a step of calculating, using the data set relating to the skin thickness, a set of as-built thickness values for the skin for at least a portion of the plurality of locations. The method may further include a step of determining the mating area of the inner surface of the skin with the mating surface of the substructure. The method may include a step of generating the set of shim dimension data by calculating, in the mating area of the inner surface of the skin, a set of deviations greater than a design allowance of the as-built thickness values from a nominal map of the skin thickness. The set of shim dimension data may define a three-dimensional shim contour. The shim predicted by the method may be configured to fill any gaps greater than a design allowance in the mating area between the inner surface of the skin and the substructure.

One or more embodiments of the present disclosure may include a system for creating a shim for use in assembling a first part defining a first mating surface to a second part defining a second mating surface. The system may use a first digital model, including a first nominal map in two horizontal dimensions and in a thickness dimension, associated with the first part. The system may also use a second digital model, including a second nominal map in two horizontal dimensions, associated with the second part. The system may predict for the shim an outline and a profile customized to fill a gap greater than a design allowance between the mating surfaces of the first part and the second part. The system may include a nondestructive inspection system configured to inspect the first part to gather a data set relating to the first part, and, a computer coupled to the nondestructive inspection system and configured to receive the data set relating to the first part and to store the first nominal map of the first part, the second nominal map of the second part, and the design allowance. The computer may include a processing element configured to calculate, from the data set relating to the first part, an as-built thickness profile for at least a portion of the first part. The processing element may be further configured to virtually overlay the first nominal map of the first part on the second nominal map of the second part to determine a mating area of the first part and the second part. The processing element may also be configured to generate in the mating area a set of shim dimension data by calculating a set of deviations greater than the design allowance of the as-built thickness profile of the first part from the nominal map of the first part.

In some embodiments, a method for creating a shim for use in mounting a skin to a substructure may make use of a digital model associated with the skin and a digital model associated with the substructure. The digital model for the skin may include two horizontal dimensions and a thickness dimension, and the digital model for the substructure may include two horizontal dimensions. The method may be used where the skin includes an as-built structure in two horizontal dimensions and in a thickness dimension. The method may be arranged for creating the shim to have a structure in two horizontal dimensions and in a thickness dimension, wherein the shim structure may be customized to compensate for a plurality of deviations greater than a design allowance of the as-built thickness of the skin from the digital model of the skin. The method may include a step of nondestructively inspecting the skin to gather a data set relating to the skin. The method may include a step of calculating, using the data set, a set of thickness values for the as-built structure of the skin. Each thickness value may be defined at a pair of coordinates in the horizontal dimensions of the skin. The method may include a step of determining a mating area of the skin with the substructure by relating the digital models of the skin and the substructure. The method may include a step of generating a digital model of the shim by calculating in the mating area of the skin a set of horizontal coordinate pairs and thickness values for deviations greater than the design allowance of the as-built thickness values from the digital model of the skin.

In some embodiments, a method for creating a shim for use in mounting a skin to a substructure, may make use of a digital model including a designed thickness profile and an outline of the skin. The method may also make use of a digital model including an outline of the substructure. The method may also make use of an as-built thickness profile of the skin. The method may create the shim with an outline and a profile customized to compensate for a plurality of deviations greater than a design allowance of the as-built thickness profile from the digital model of the designed thickness profile. The method may include a step of nondestructively inspecting the skin to gather a data set. The method may also include a step of calculating, using the data set, the as-built thickness profile of at least a portion of the skin. The as-built thickness profile may include a set of thickness values, each thickness value being defined at a location on the skin. The method may also include a step of determining a mating area of the skin with the substructure by relating the digital models of the outlines of the skin and the substructure. The method may also include a step of generating a digital model of the outline and profile of the shim by calculating in the mating area of the skin a set of locations and values of deviations greater than the design allowance of the as-built thickness values from the designed thickness profile. The method may also include a step of using the digital model of the shim to construct the shim, which step may include use of an additive manufacturing technique, such as printing the shim with a 3D printer. The method may include a step of recording in a database the set of locations and values of the deviations of the as-built thickness profile from the designed thickness profile for use in subsequent production of another skin.

In some embodiments, the method for creating the shim may be used where the skin and the substructure each include at least one pre-formed assembly hole aligned with one another. The step of generating the digital model of the shim may include defining an assembly hole in the shim aligned with the pre-formed assembly holes of the skin and the substructure.

In some embodiments, a method for making a shim for use in mounting a first part to a second part may be used where at least one of the first part and the second part defines a first thickness profile. The method may be arranged to construct the shim with an outline and a profile customized to fill a gap greater than a design allowance between the first part and the second part. The method may include a step of nondestructively inspecting at least one of the first part and the second part to gather a data set. The method may include a step of calculating, using the data set, a set of as-built thickness values of at least a portion of at least one of the first part and the second part. The method may include a step of virtually overlaying the first part on the second part to determine a mating area of the first part with the second part. The method may include a step of calculating in the mating area for at least one of the first part and the second part a set of the deviations greater than the design allowance of the as-built thickness profile from the designed thickness profile. The method may include a step of constructing the shim to have the outline and profile to match the deviations in the mating area. The method may include calculating the set of the deviations for both the first part and for the second part. The method may include a step of recording in a database the set of the deviations of the as-built thickness profile from the designed thickness profile for use in subsequent production of additional first and second parts.

In some embodiments, the method for making a shim for use in mounting a first part to a second part may be used where the first part and the second part each include at least one pre-formed assembly hole aligned with one another. The method may include, in a step of constructing the shim, the forming of an assembly hole in the shim aligned with the pre-formed assembly holes of the first part and the second part.

In some embodiments, a method for assembling a skin to a substructure may be used where the skin includes a designed thickness profile and an as-built thickness profile, and the substructure defines a mounting surface corresponding to a mating area of the skin. The method may include a step of virtually overlaying the skin on the substructure to determine the mating area of the skin with the mounting surface of the substructure. The method may include a step of calculating in the mating area of the skin a set of the deviations greater than a design allowance of the as-built thickness profile from the designed thickness profile. The method may include a step of constructing a shim with an outline and profile matching the set of the deviations in the mating area of the skin. The method may include a step of assembling the skin to the substructure with the shim installed therebetween. The method may be used where the skin and the substructure each include at least one pre-formed assembly hole aligned with one another. The method may include, in the step of constructing the shim, forming an assembly hole in the shim aligned with the pre-formed assembly holes of the skin and the substructure. The method may include a step of recording in a database the set of the deviations of the as-built thickness profile from the designed thickness profile for use in subsequent production of another skin. The method may include a step of inspecting the skin with ultrasound, e.g., by pulse-echo testing or by through-transmission testing, to determine the as-built thickness profile of the skin. The method may include that the step of virtually overlaying the skin on the substructure to determine the mating area of the skin with the substructure precedes the step of calculating the as-built thickness of the skin. The method may include that the as-built thickness of the skin is calculated only in the mating area of the skin.

Features, functions, and advantages may be achieved independently in various embodiments of the present disclosure, or may be combined in yet other embodiments, further details of which can be seen with reference to the following description and drawings.

BRIEF DESCRIPTION OF THE DRAWINGS

FIG. 1 is a cross-sectional view of a skin mating with a substructure, showing a set of deviations in the thickness profile of the skin leaving a gap between an inner mating surface of the skin with the upper mating surface of the substructure.

FIG. 2 is a cross-sectional view of a shim having an outline and profile for filling the gap between the parts of FIG. 1.

FIG. 3 is a schematic view of an ultrasound system for nondestructive inspection of a part, showing an ultrasound transmitter on one side of the part and an ultrasound receiver on an opposite side of the part, for probing the part by through-transmission of ultrasound.

FIG. 4 is a schematic view of an ultrasound system for nondestructive inspection of a part, showing an ultrasound transmitter and receiver positioned on the same side of the part, for probing the part by pulse-echo analysis.

FIG. 5 is a perspective view of an ultrasound inspection system, showing an aero-surface or skin, in particular an aircraft flap, as the part under inspection, mounted on a gantry for movement in relation to the inspection, and also showing an extendable arm with an accordion enclosure and an end effector that includes a water nozzle and an ultrasound transducer for inspection of the part, representing either a pulse-echo system, or, in combination with a corresponding arm (not visible) behind the part under inspection, a through-transmission system.

DESCRIPTION

Figure 6:
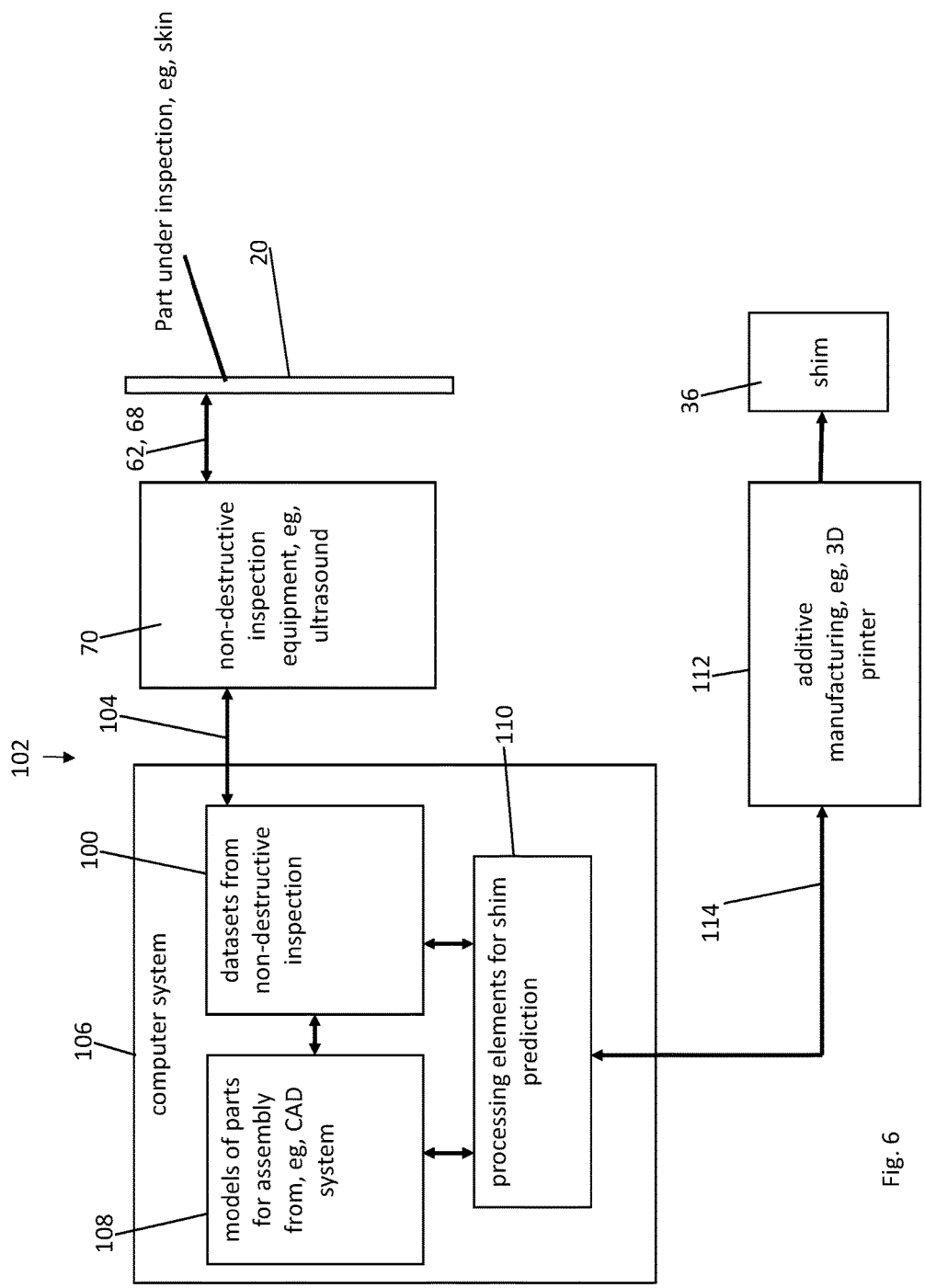
FIG. 6 is a block diagram of a system for predicting and constructing a shim according to an embodiment of the present disclosure, including a computer system storing models of parts or components, such as the aero-surface of FIG. 5, and datasets relating to parts or components that have undergone nondestructive inspection, a nondestructive inspection system, such as the ultrasound equipment of FIG. 3, 4, or 5, and an additive manufacturing system, such as a 3D printer.

Various embodiments of methods and systems for predicting the size and shape of a shim using data from nondestructive inspection are described below and illustrated in the associated drawings. Unless otherwise specified, the methods and systems and/or their various constituent pieces may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other similar embodiments, such as those for constructing the predicted shim. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Embodiments of the present disclosure may eliminate the need to pre-assemble parts, such as pre-assembling a skin to a substructure, and manually to measure the gap condition(s) in order to estimate a shim location, contour, and dimensions. Embodiments of the present disclosure are directed to automating the data collection process to determine location, shape, and size of required shims and may automatically deliver all required data to automated shim fabrication systems. Embodiments of the present disclosure may allow shimming requirements to be established with required shims produced and installed in advance of assembly operations. The expected result is effectively to remove significant labor cost and cycle time from critical path assembly operations. Embodiments of the present disclosure may provide for automated statistical process control (SPC) data collection and analysis to support process capability determination for improved efficiency and quality, and more repeatable processes. Embodiments of the present disclosure may reduce shimming requirements, particularly where data analytics demonstrate a repeatability that can be mitigated through changes to design and manufacturing processes. Embodiments of the present disclosure may support Full Size to Full Size Determinate Assembly and Precision Assembly (FSDA/PA), which may allow detail parts, substructure, and skins to be fabricated complete with all holes incorporated in the final designed condition. This in turn may allow assembly to occur without the performance of drilling operations on assembly, further eliminating significant labor cost and cycle time from assembly operations, reducing nonconformances, and eliminating a major source of workplace recordable injuries and lost work days.

Embodiments of the present disclosure have the potential to eliminate one or more temporary assembly operations, with a substantial cost savings.

FIG. 1 illustrates two components or parts aligned for assembly and a gap between the two parts, and FIG. 2 shows a shim for filling the gap. More specifically, a first component or part, such as an aero-surface or skin 20, defines an inner surface 22 and an outer surface 24. Typically, inner surface 22 and outer surface 24 are substantially parallel to one another. Skin 20 defines a thickness 26 between surfaces 22 and 24, which may vary in value over the surface area. Thickness 26 is defined in a direction that is perpendicular to at least one of the surfaces, and, in cases where the surfaces are substantially parallel, perpendicular to both surfaces. Skin 20 is being aligned in FIG. 1 with a second part, such as a substructure 28, which may, e.g., be a structural spar or rib. Substructure 28 includes an upper mating surface 30. Inner surface 22 of skin 20 may be received on upper mating surface 30 of substructure 28.

A gap 32 may exist between surface 22 and surface 30 for one or more reasons of variation in the parts' structures, e.g., due to an as-built thickness dimension or profile of the skin deviating in an area from a designed thickness profile. Gap 32 may vary over the area, as indicated by the differing heights of arrows 34a-f. The cross-sectional view of FIG. 1 shows the set of deviations of the as-built thickness profile from the designed thickness profile along a first dimension, and the set of deviations will also be distributed along a second dimension, the deviations in the two dimensions defining an outline of the area of the gap. Gap 32 in FIG. 1 is illustrated as resulting from one part having such deviations in thickness, and other variations in part structure may result in gaps.

A shim 36 for filling the gap is shown in FIG. 2, which typically has a minimum thickness 38 corresponding to an engineering design allowance 40 (FIG. 1). For example, engineering requirements for joining an aero-surface to a substructure typically define a design allowance of about 0.005" to 0.008", depending on aerodynamic and structural considerations, where deviations greater than the design allowance may require shimming of the gap. The range of the design allowance will also vary for the size and geometry of the parts being assembled, so the design allowance may be many times greater or smaller than the example range. Generally, the design allowance for gaps will correspond to a design tolerance for one part's thickness, and the shim may be sized and shaped correspondingly with the part's thickness deviations greater than the design tolerance. Where other variations in part structure result in gaps or the thicknesses of both parts deviate in a substantial manner, the relationship between the thickness deviations and the shim size and shape may be more complex.

Shim 36 has a profile 42 and an outline 44 configured substantially to fill gap 32. For example, as seen along one dimension of outline 44 in FIG. 2, shim 36 has a generally wedge-shaped profile, increasing from the minimum thickness on a left edge 48 through thickness values 46a-f to a right edge 50, generally corresponding to the differing heights 34a-f of gap 32 related to the deviations of the as-built thickness of skin 20 from its designed thickness profile. The outline of the shim is two-dimensional in a plane generally coplanar with the planes of one or both of the mating surfaces. The second dimension (not shown in FIG. 2) of outline 44 is along edges 48, 50.

As shown in FIG. 2, edges 48, 50 of shim 36 correspond to a pair of edges 52, 54 of substructure 28—shim 36 has an outline for filling the gap between the two parts where their surfaces mate and typically does not extend beyond that. Alternatively, shim 36 may have an outline extending beyond the mating surfaces where best suited to a particular application. Shim 36 includes an upper surface 56 for mating with inner surface 22 of skin 20 and a lower surface 58 for mating with upper surface 30 of substructure 28.

Profile 42 of shim 36, as shown in the example of FIG. 2, has a simple wedge shape because that corresponds to the shape of gap 32. Generally, the shim profile will be configured to fill such gap for any shape of the gap. For example, the shim may have a structure in two horizontal dimensions and in a thickness dimension that is customized to compensate for the deviations greater than the design allowance of the as-built thickness of the skin from the designed thickness profile of the skin. As will be discussed below, such shim structure may be more complex than a wedge shape.

As noted above, nondestructive inspection to characterize part qualities, such as checking porosity and for delaminations, may be required and carried out for parts prior to assembly. Ultrasound analysis is an example of nondestructive inspection. An ultrasound system may use pulse-echo or through-transmission techniques to gather data in such inspection. Typically for pulse-echo, an arm of the inspection system has, as shown in FIG. 3, an end effector 60 holding a water nozzle and an ultrasonic transducer that combines transmit and receive functions. End effector 60 may be moved over a surface of the part being inspected, and/or the part itself may be moved. The water nozzle provides a stream of water which carries an ultrasound signal 62 from the transducer into part 20. The ultrasound enters part 20 at either surface, e.g., surface 24 and travels through part 20, and bounces off the opposite surface, e.g., surface 22 of the part and returns to the sending transducer. Similarly, as shown in FIG. 4, a through-transmission ultrasound system may include a pair of end effectors 64, 66, one responsible for transmitting an ultrasound signal 68 and the other receiving it. Typically, each end effector is positioned to transmit and/or receive the ultrasound in a direction that is perpendicular to at least one of the surfaces, and, in the case of the surfaces being substantially parallel, perpendicular to both surfaces.

Typically, the velocity of sound in the material under inspection is known, as well as the spacing of each transmitter/receiver from the adjacent part surface. The ultrasound system is able to measure the time it takes for the ultrasonic signal to travel through the part, for example by gating an A-scan trace. The system typically makes and records each measurement for a location, defined by a coordinate pair in two horizontal dimensions, and this location is the same on both part surfaces. From this data, the ultrasound system or a connected computer may calculate the material thickness (rate X time=distance) at each location to which the system moves the end effector(s). For example, the inspection may involve a series of scan passes, where each scan pass produces a line of ultrasonic data. The series of scan passes may be built into a full picture of the part's thickness values at a set of locations over a 2-dimensional area of the part.

An example of an ultrasound inspection system 70 is shown in FIG. 5 where part 20, in this case an aircraft flap, is mounted on a gantry 72, allowing movement in relation to the inspection. An arm 74 may be movable in up-and-down and left-right dimensions, and may include an accordion enclosure 76 facilitating extension of arm 74 closer to, and farther from surface 24 of part 20. End effector 64 may include a water nozzle 78 to provide a stream of water to surface 24 (or surface 22). End effector 64 may include an ultrasound transmitter for providing the ultrasound signal via the stream water for inspection of the part. In a through-transmission system, end effector 66 with an ultrasound receiver may be mounted on an arm (not visible behind the part under inspection in FIG. 5) corresponding to arm 74. Alternatively, arm 74 may mount an ultrasound transducer for inspection of the part by pulse-echo analysis.

As can be seen in FIGS. 3-5, the ultrasound inspection system allows for nondestructively inspecting part 20 to gather a data set 100 (see FIG. 6) relating to part 20. Data set 100 may include information about the as-built structure of part 20 in two horizontal dimensions 80, 82, such as soundwave travel times, relating to a thickness dimension. The thickness dimension typically is defined as orthogonal to horizontal dimensions 80, 82. The soundwave travel times and related information (such as material density and structure or other information relating to the speed of sound in the material) may be used to calculate a set of thickness values for the as-built structure of part 20. Each thickness value may be defined at a location, e.g., a pair of coordinates in horizontal dimensions 80, 82 of part 20.

As further seen in FIG. 5, gantry 72 of the inspection system may include various positioning and alignment tools 84*a-c* to aid in relating the inspection's measurements to the as-built structure. The part's as-built structure may also include one or more alignment indicators 86, each of which may be a mark for alignment and/or for future location of an assembly hole, or may be a pre-formed (in original construction or pre-drilled) assembly hole. Typically, alignment indicators 86 are placed at known, measured locations on the part corresponding to locations established for the design of the part. The inspection system may use one or more of the alignment indicators in relating measurements of the as-built structure to the design of the part.

As shown in FIG. 6, a system 102 for inspecting part 20 and predicting and manufacturing shim 36 for use in assembling part 20 to another part. System 102 may include nondestructive inspection equipment, such as ultrasound system 70. Such equipment may be configured to apply ultrasound signals 62 or 68 to part 20 and to communicate data 104 from the ultrasound measurements to a computer system 106. FIG. 6 depicts computer system 106 as separate from ultrasound system 70 and alternatively one or more portions or the whole of the computer system may be built-in to ultrasound system 70. Other division of the processing of data from inspection and the predicting and manufacturing of shims may be implemented as best suited to particular applications of embodiments of the present disclosure.

Computer system 106 may store one or more data sets 100 from the nondestructive inspection of skin 20. Computer system 106 may also store digital models 108 of parts, such as skin 20 and substructure 28. Models 108 may be sourced from a separate CAD system used to design skin 20 and/or substructure 28, or from another source, or computer system 106 may incorporate the CAD system used to design such parts.

A digital model 108 for a part, such as skin 20, may include a digital model that includes a nominal map for the skin in two horizontal dimensions and in a thickness dimension. A digital model 108 for a part, such as substructure 28 may include a nominal map for the substructure in two horizontal dimensions and in a thickness or height dimension. Computer system 106 may include one or more processing elements 110 that may make use of the digital models and the data sets from nondestructive inspection for predicting the size and shape of shim 36. Further details on the digital models, the inspection data sets, and the processing of data for shim prediction will be discussed in relation to FIGS. 8-13 below.

As further shown in FIG. 6, computer system 106 may be in communication with equipment, such as an additive manufacturing device 112, e.g., a 3D printer and/or other means of shim construction such as by machining with a numeric control (NC) program, of shim 36. For example, computer system 106 may generate a digital model 114 for shim 36. Computer system 106 may also send model 114 to additive manufacturing device 112, where the 3D printer or other equipment may use the digital model of the shim to construct the shim.

Model 114 for shim 36 may include a set of horizontal coordinate pairs and thickness values for shim 36. Generally, such thickness values will correspond to deviations 34 of the as-built thickness values of the skin from the digital model of the skin. Typically, such thickness values only include those that are greater than design allowance 40. Model 114 for shim 36 may also include a shim contour defined in three dimensions or a set of shim dimension data, in either case corresponding to the set of deviations 34 (typically those greater than the design tolerance) of the as-built thickness values for the skin from the nominal map of the skin thickness. Model 114 may also include outline 44 and profile 42 for shim 36, which may include a set of locations and values of deviations (typically those greater than the design tolerance) of the skin's as-built thickness values from the skin's designed thickness profile. In any of the foregoing cases for model 114 for shim 36, model 114 may include definition of an assembly hole (see FIG. 14) to be formed during construction of shim 36 and aligned with pre-formed assembly holes of one or both of the skin and the substructure.

Figure 7:
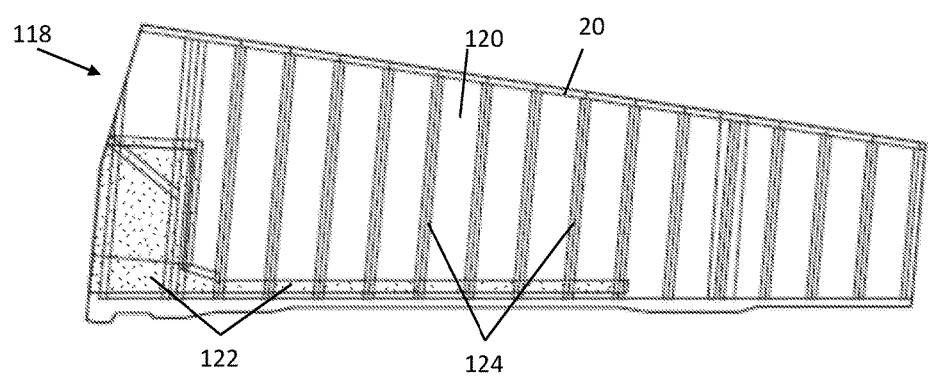
FIG. 7 is a plan view of a representation of the inspection results for the aero-surface of FIG. 5, illustrating with variant cross-hatching and stippling a set of as-built thickness values for the aero-surface distributed over the horizontal dimensions of the aero-surface.

FIG. 7 shows an ultrasonic scan 118 of skin 20, which, in the particular example, is formed of composite material. The process of forming a skin of composite material may produce variations in the thickness of the skin. Other methods of forming parts also may result in thickness variations. The varying thickness values found by ultrasonic scan 118 over the two-dimensional area of skin 20 are illustrated in FIG. 7: blank spaces 120 represent areas of minimum thickness; areas of stippling 122 represent areas of medium thickness; and lines 124 represent areas of the maximum thickness.

FIG. 7 is a representation of the profile of the as-built thickness structure of skin 20 in two horizontal dimensions and in a thickness dimension, displaying thickness values for skin 20 over a plurality of locations in the two horizontal dimensions. This representation is simplified for illustrative purposes and typically the nondestructive inspection produces accurate, high-resolution (e.g., to 0.0001-inch) measurements of the as-built thickness values and of the location coordinates in the horizontal dimensions. An ultrasound inspection of the as-built structure of a part is believed to provide an advantage over other methods of part inspection (both manual and automated) for predicting and constructing a shim, which may be attributed to the degree of accuracy resulting from the ultrasound inspection. The results, such as the set of deviations of the as-built thickness profile from the designed thickness profile, from such inspection may be recorded in a database for use in subsequent production of another skin. The results may be useful for purposes of establishing and controlling manufacturing assembly process capability, e.g., in identifying a trend in variations in production that will allow adjustment of production variables to reduce deviations of the as-built structure from the designed structure.

Figure 8:
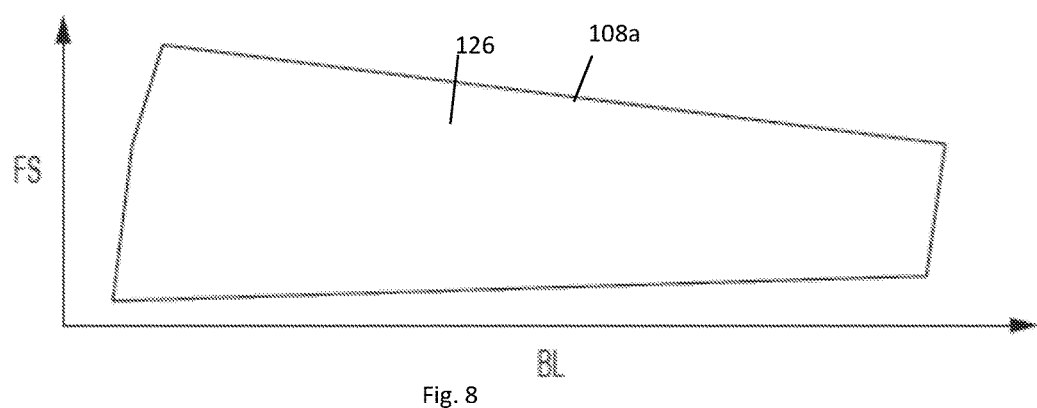
FIG. 8 is a plan view of a digital model for the aero-surface of FIG. 5, illustrating a nominal map of the designed thickness profile of the aero-surface over the horizontal dimensions or outline of the aero-surface, in this case the designed thickness profile being a constant over the horizontal dimensions of the aero-surface, and the horizontal outline being shown in aircraft coordinates: fuselage station (FS), and butt line (BL).

A representation of a digital model 108*a* of skin 20 is shown in FIG. 8, illustrating the nominal map of the designed thickness profile of skin 20. In this case, the designed thickness profile is a constant thickness value over the horizontal dimensions of the skin, indicated by the unstippled, unlined area 126. Digital model 108*a* of skin 20 may include one or more coordinate systems for identifying horizontal locations: for example, a part-specific coordinate system, such as that using dimensions 80, 82 as shown in FIG. 6, or an aircraft-specific coordinate system, such as that using aircraft coordinates fuselage station (FS) and butt line (BL) as shown in FIG. 8. Generally, each coordinate system will include one or more reference locations for registering and synchronizing such coordinate system with another coordinate system.

Figure 9:
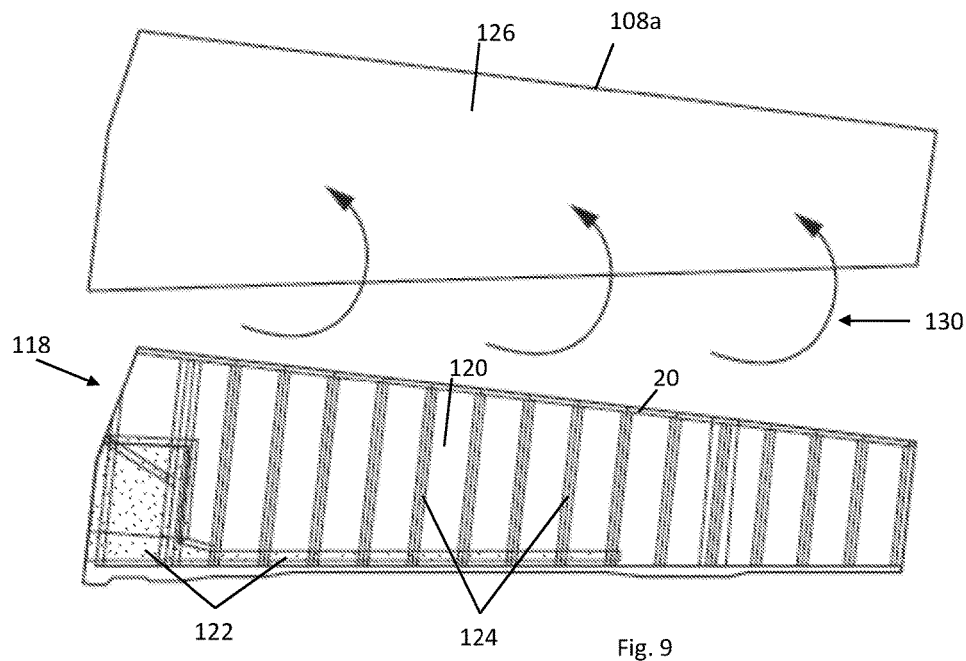
FIG. 9 is a plan view illustrating how the as-built thickness values of the aero-surface may be virtually overlaid on the digital model of the nominal map of the aero-surface.

An illustration is shown in FIG. 9 of virtually overlaying ultrasonic scan 118 of as-built thickness values of skin 20 onto digital model 108*a* of the nominal map of skin 20. Computer system 106 may perform such virtual overlaying and predict areas that may potentially require a shim and manufacturing such shim(s), all in an automated fashion. Alternatively, an operator can manually select areas for potential shimming, using a graphic interface to the representation of the as-built thickness profile. The graphic interface may also overlay the as-built thickness profile on the digital model of the skin and/or the digital model of the substructure and/or a representation of the as-built substructure to aid in selecting areas for potential shimming.

Substructure 28 may similarly be inspected, e.g., by a nondestructive process such as ultrasound, which may gather information about the as-built structure of substructure 28. The information about the as-built structure may be compared to the digital model of the substructure and used alone or in combination with information about the as-built structure of the skin for predicting and manufacturing a shim for a joint between the skin and the substructure.

Arrows 130 in FIG. 9 represent how a coordinate system for the as-built thickness profile may require registration and synchronization with the digital model of the designed thickness profile. For example, coordinates from the scan of the as-built part may be in a coordinate system unique to that scan or may be unique to the type of part that was scanned. Information in such a coordinate system may need to be transformed into a coordinate system specific to the digital model of the part. Such digital model may be, for example, in aircraft coordinates, which may require registration and synchronization with the scan coordinates. Typically, each point on the ultrasonic scan is defined by a coordinate pair that can be mapped to corresponding aircraft coordinates.

Figure 10:
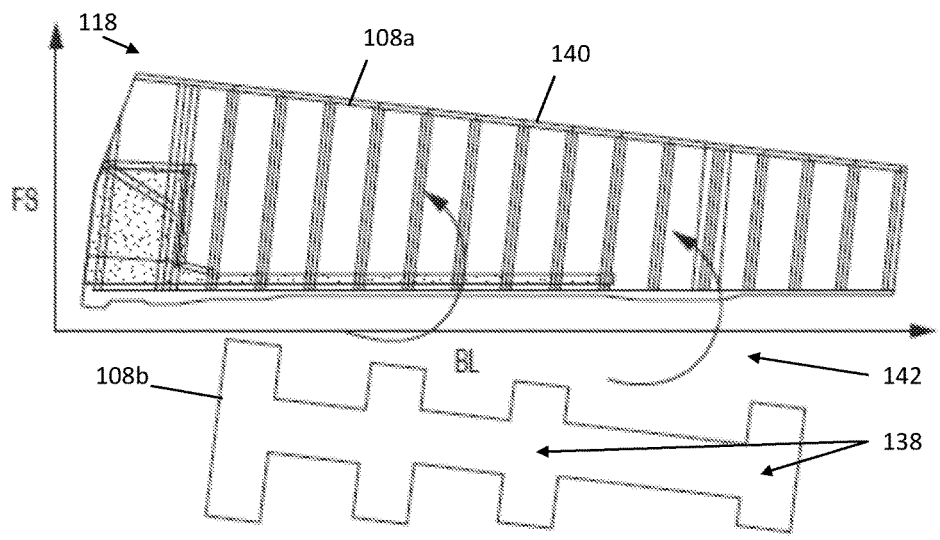
FIG. 10 is a plan view illustrating, in aircraft coordinates, the as-built thickness values of the aero-surface virtually overlaid on the digital model of the nominal map of the aero-surface, and illustrating how a digital model of an outline of a substructure, to which the aero-surface will be mounted, may be virtually overlaid on the combined as-built thickness values and digital model of the aero-surface.

A combined map 140, shown in FIG. 10, results from the virtually overlaying of the as-built thickness profile onto the digital model of the nominal map of the skin. Combined map 140 may include aircraft coordinates FS, BL that may be useful in the next step, also shown in FIG. 10, of registering and synchronizing a digital model 108*b* of substructure 28, to which skin 20 will be assembled. Digital model 108*b* of substructure 28 may be in aircraft coordinates, facilitating its being virtual overlaid on combined map 140. Alternatively, if digital model 108*b* is in a different coordinate system then a process of transformation may be necessary to register and synchronize digital model 108*b* with combined map 140. In any case, arrows 142 illustrate this virtual overlaying with such registering and synchronization as may be necessary for a particular application.

Figure 11:
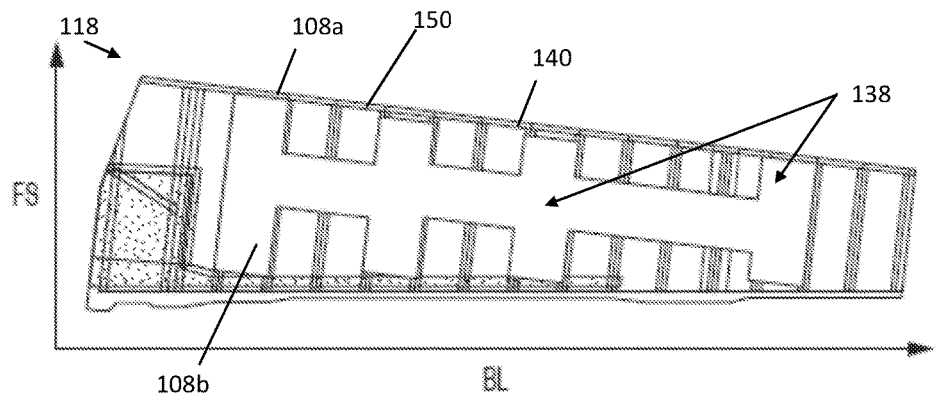
FIG. 11 is a plan view illustrating the virtual overlaying of the as-built thickness and the digital model of the nominal map of the aero-surface, and illustrating how a digital model of an outline of a substructure, to which the aero-surface will be mounted, may be virtually overlaid on the combined as-built thickness values and digital model of the aero-surface.

A virtual assembly map 150, shown in FIG. 11, is the result of virtually overlaying digital model 108*b* of substructure 28 on combined map 140 (of the as-built skin structure on the model of skin 20). Virtual assembly map 150 may include aircraft coordinates, or may use another coordinate system as best suited for registering and synchronizing the components of map 150 for the virtual overlay.

Digital model 108*b* as depicted in FIGS. 10 and 11 represents one or more mating areas 138 of substructure 28 where upper surface 30 (FIG. 1) of substructure 28 may be intended to be in contact with, and assembled to, skin 20. Mating area(s) 138 may be plural separate areas on upper surface 30 of substructure 28 or may be substantially all of upper surface 30. Typically, the portion(s) of upper surface 30 that is/are mating area(s) 138 is/are identified as such in digital model 108*b*.

Figure 12:
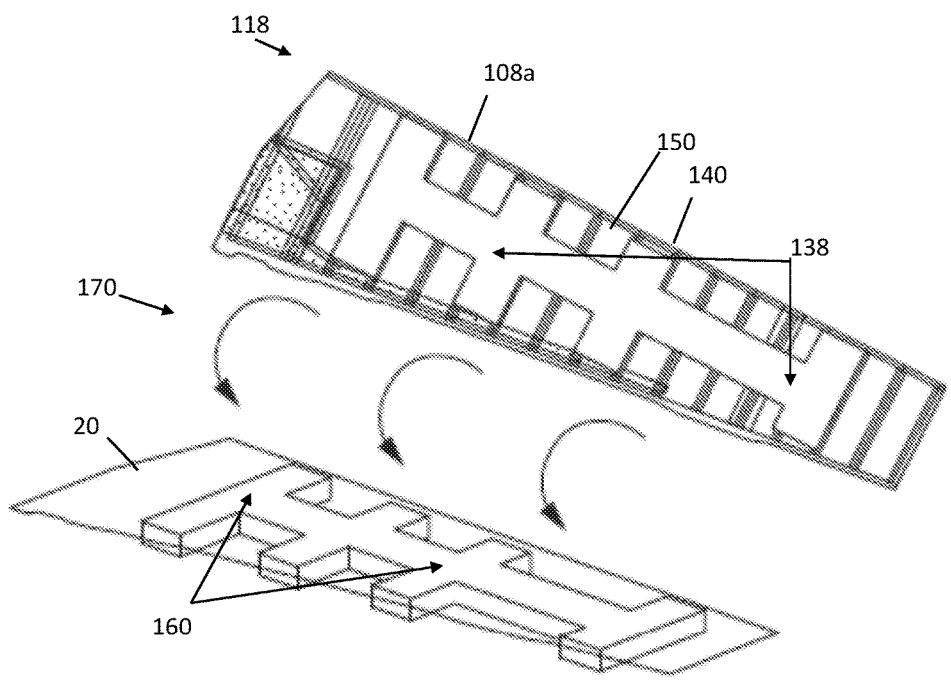
FIG. 12 is an isometric view illustrating a transformation of the virtual overlays of FIGS. 9-11 for calculating a set of deviations of the as-built thickness values from the nominal map of the aero-surface thickness.

FIG. 12 illustrates how one or more mating area(s) 160 of skin 20 with substructure 28 may be determined by relating the digital models of the outlines of the skin and the substructure. As described above, mating area(s) 138 of substructure 28 have been related to digital model 108*a* of skin 20 by registering and synchronizing them with the combined as-built and designed map 140 of skin 20 in virtual assembly map 150.

With mating area(s) 160 of skin 20 determined, computer system 106 may generate digital model 114 of the outline and profile of shim 36 by calculating in mating area(s) 160 of skin 20 a set of locations and values of deviations of the as-built thickness values from the designed thickness profile. Alternatively, computer system 106 may calculate a set of locations and values of deviations of the as-built thickness values from the designed thickness profile prior to a determination of mating area(s) 160. In this alternative case, typically a determination of mating area(s) 160 will be made, or an area for potential shimming will be otherwise determined, and digital model 114 of shim 36 will be generated only for such area(s). See FIGS. 15 and 16.

Figure 13:
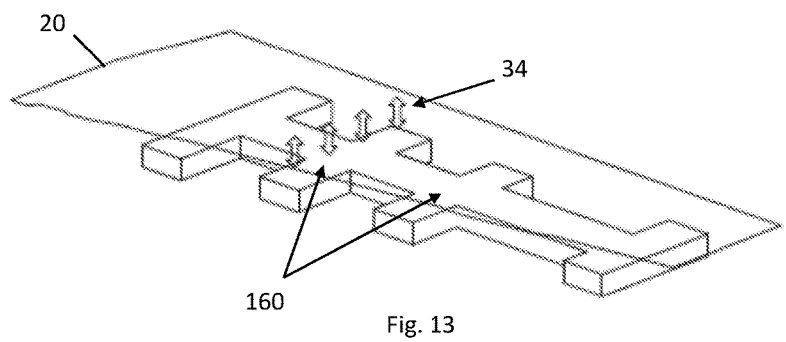
FIG. 13 is an isometric view illustrating the calculations in the mating area of the aero-surface and the substructure the set of deviations greater than a design allowance of the as-built thickness values from the nominal map of the aero-surface thickness.

FIG. 12 also illustrates with arrows 170 that the as-built thickness values in scan 118 may be inverted to simulate mechanical joining of parts 20 and 28. Such inversion may facilitate calculating, as illustrated by FIG. 13, the set of deviations 34 greater than the design tolerance that may be used in digital model 114 of shim 36. As described above, such calculating of deviations 34 for model 114 of shim 36 may be performed automatically, or, may involve an operator using a visualization of the deviations from the nominal map to analyze, on a case by case basis, potential shimming across the areas that correspond to the mating surfaces of the skin with the substructure. For example, the operator may take a variety of slices across the mating area(s) to obtain the profile of the shim. In either case, as described above, once the profile of the shim is known, model 114 of the shim may be created and exported to an NC program for machining, or to an additive manufacturing installation for 3D printing.

Figure 14:
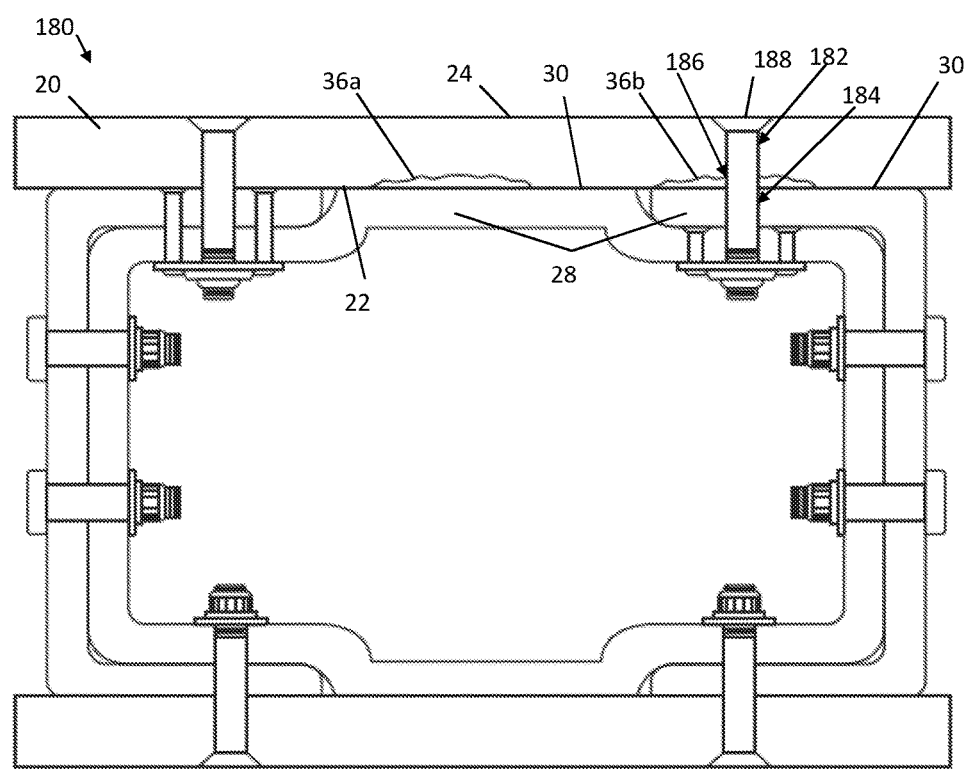
FIG. 14 is a cross-sectional view of a pair of shims constructed by additive manufacturing and installed between a skin and a substructure in accordance with the present disclosure.

As shown in FIG. 14, an assembly 180 of skin 20 at inner surface 22 to substructure 28 at upper surface 30 may include shims 36*a*, 36*b*. Assembly 180 may involve a pre-formed hole 182 in skin 20, a pre-formed hole 184 in substructure 28, and a pre-formed hole 186 in shim 36*b*. One or more fasteners 188 may fix the parts together at holes 182, 184 and similar sets of holes. Typically, pre-formed holes 182 and 184 in the skin and substructure must be aligned with a high degree of accuracy. Hole 186 in shim 36 may be pre-formed with a corresponding degree of accuracy due to the high degree of accuracy in the location by ultrasound inspection of thickness deviations in the skin and the ability, in the subsequent location of hole 186 in shim 36*b*, to identify such location in a coordinate system, such as an aircraft coordinate system common to both the skin and the substructure.

Figure 15:
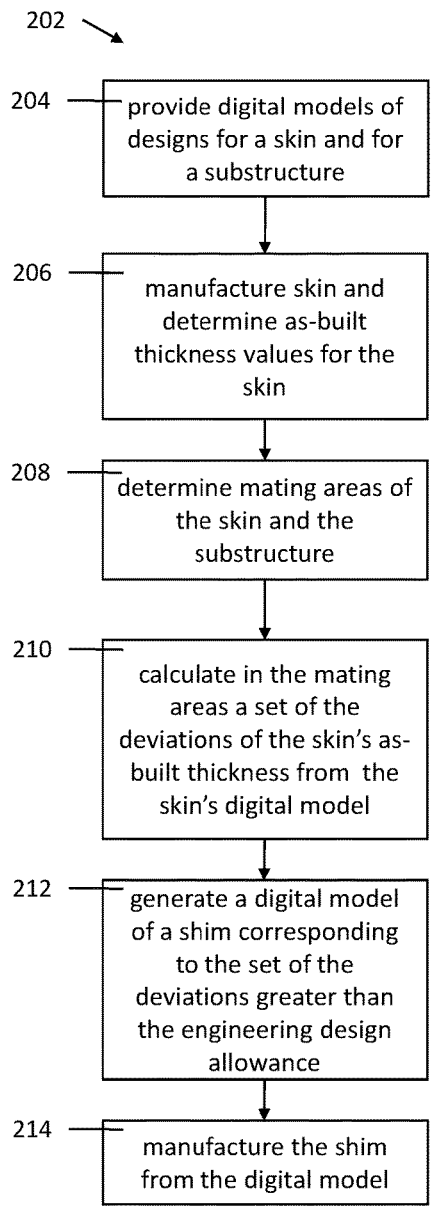
FIG. 15 is an illustration of operations performed in one or more embodiments of the present disclosure, showing the step of virtual determination of the mating area of the skin and substructure being performed before the step of calculating the set of deviations of the as-built thickness values from the nominal thickness values, the calculating of the set of deviations being performed only in the mating area.

FIG. 15 provides a flowchart illustrating a set of operations 202 performed to predict the location, outline, and profile of shim 36 to fill gap 32 between substructure 28 and skin 20. Operations 202 may include a step 204 of providing digital models of designs for a skin and a substructure. Operations 202 may include a step 206 of manufacturing the skin and determining the as-built thickness values for the skin. Operations 202 may include a step 208 of determining the mating areas 138, 160 of the skin and the substructure. Operations 202 may include a step 210 of calculating in the mating areas a set of the deviations of the skin's as-built thickness from the skin's digital model. Operations 202 may include a step 212 of generating a digital model of a shim corresponding to the set of deviations greater than the engineering design allowance. Operations 202 may include a step 214 of manufacturing the shim from the digital model. For the one or more embodiments represented by FIG. 15, the step of virtual determination of mating areas 138, 160 of substructure 28 and skin 20 is performed before the step of calculating the set of deviations of the skin's as-built thickness values from the skin's nominal thickness values. After determination of mating areas 138, 160, the calculating of the set of deviations may be performed only in the mating area. The generation of digital model 114 of shim 36 may be accomplished using the deviations.

Figure 16:
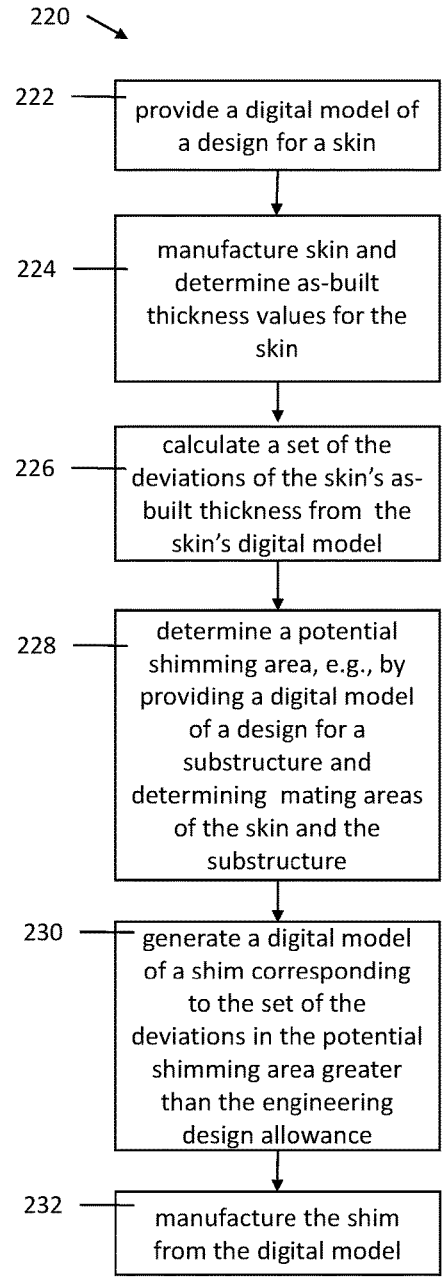
FIG. 16 is an illustration of operations performed in one or more embodiments of the present disclosure, showing the step of virtual determination of the mating area of the skin and substructure being performed after the step of calculating the set of deviations of the as-built thickness values from the nominal thickness values, the calculating of the set of deviations being performed for the entirety of the skin outline.

FIG. 16 provides a flowchart illustrating a set of operations 220 also performed to predict the location, outline, and profile of shim 36 to fill gap 32 between substructure 28 and skin 20. Operations 220 may include a step 222 of providing a digital model of a design for a skin. Operations 220 may include a step 224 of manufacturing the skin and determining the as-built thickness values for the skin. Operations 220 may include a step 226 of calculating a set of the deviations of the skin's as-built thickness from the skin's digital model. Operations 220 may include a step 228 of determining a potential shimming area, e.g., by providing a digital model of a design for a substructure and determining the mating areas 138, 160 of the skin and the substructure. Operations 220 may include a step 230 of generating a digital model of a shim corresponding to the set of deviations in the potential shimming area greater than the engineering design allowance. Operations 220 may include a step 232 of manufacturing the shim from the digital model. For the one or more embodiments represented by FIG. 16, the step of calculating the set of deviations of the skin's as-built thickness values from the skin's nominal thickness values is formed prior to, or otherwise without making use of information about the mating areas 138, 160. The step of virtual determination of mating areas 138, 160 of the skin and substructure may be performed after the calculating of the set of deviations. Typically, the step of calculating the set of deviations according to FIG. 16 will be performed for the entirety of the skin outline. In a FIG. 16 embodiment, a determination of mating areas 138, 160 may be made, or an area for potential shimming may be otherwise determined, and digital model 114 of shim 36 will be generated only for such area(s).

Aspects of one or more embodiments of the present disclosure for a system and method for predictive shimming of joints may be embodied as a computer method, computer system, or computer program product. Accordingly, aspects of one or more embodiments of the present disclosure for a system and method for predictive shimming of joints may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of one or more embodiments of the present disclosure for a system and method for predictive shimming of joints may take the form of a computer program product embodied in a computer-readable medium (or media) having computer-readable program code/instructions embodied thereon.

Any combination of computer-readable media may be utilized. Computer-readable media can be a computer-readable signal medium and/or a computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a computer-readable storage medium may include any suitable tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, radio frequency (RF), and/or the like, and/or any suitable combination of these.

Computer program code for carrying out operations for aspects of the one or more embodiments of the present disclosure for a system and method for predictive shimming of joints may be written in one or any combination of programming languages, including an object-oriented programming language such as Java, Smalltalk, C++, and/or the like, and conventional procedural programming languages, such as the C programming language. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), and/or the connection may be made to an external computer (for example, through the Internet using an Internet Service Provider).

Aspects of one or more embodiments of the present disclosure for a system and method for predictive shimming of joints are described above with reference to flowchart illustrations and/or block diagrams of methods, apparatuses, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block or blocks.

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block or blocks.

Any flowchart and/or block diagram in the drawings is intended to illustrate the architecture, functionality, and/or operation of possible implementations of systems, methods, and computer program products according to aspects of one or more embodiments of the present disclosure for a system and method for predictive shimming of joints. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

An embodiment of the present disclosure may include a method for creating a shim for use in mounting a skin to a substructure, the skin associated with a digital model for the skin in two horizontal dimensions and in a thickness dimension, and the substructure associated with a digital model for the substructure in two horizontal dimensions, and wherein the skin includes an as-built structure in two horizontal dimensions and in a thickness dimension, the method arranged for creating the shim to have a structure in two horizontal dimensions and in a thickness dimension, the shim structure customized to compensate for a plurality of deviations greater than a design tolerance of the as-built thickness of the skin from the digital model of the skin, wherein the method may include the steps of:
  a. nondestructively inspecting the skin to gather a data set relating to the skin;
  b. calculating, using the data set, a set of thickness values for the as-built structure of the skin, each thickness value being defined at a pair of coordinates in the horizontal dimensions of the skin;
  c. determining a mating area of the skin with the substructure by relating the digital models of the skin and the substructure;
  d. generating a digital model of the shim by calculating in the mating area of the skin a set of horizontal coordinate pairs and thickness values for deviations greater than the design tolerance of the as-built thickness values from the digital model of the skin.

An embodiment of the present disclosure may include a method for creating a shim for use in mounting a skin to a substructure, wherein a digital model including a designed thickness profile and an outline of the skin is associated with the skin, and wherein a digital model including an outline of the substructure is associated with the substructure, and wherein the skin includes an as-built thickness profile, the method arranged for creating the shim with an outline and a profile customized to compensate for a plurality of deviations greater than a design tolerance of the as-built thickness profile from the digital model of the designed thickness profile, wherein the method may include the steps of:
  a. nondestructively inspecting the skin to gather a data set;
  b. calculating, using the data set, the as-built thickness profile of at least a portion of the skin, the as-built thickness profile including a set of thickness values, each thickness value being defined at a location on the skin;
  c. determining a mating area of the skin with the substructure by relating the digital models of the outlines of the skin and the substructure;
  d. generating a digital model of the outline and profile of the shim by calculating in the mating area of the skin a set of locations and values of deviations greater than the design tolerance of the as-built thickness values from the designed thickness profile.

An embodiment of the present disclosure may include a method for assembling a skin to a substructure, wherein the skin includes a designed thickness profile and an as-built thickness profile, and wherein the substructure defines a mounting surface corresponding to a mating area of the skin, wherein the method may include the steps of:
  a. virtually overlaying the skin on the substructure to determine the mating area of the skin with the mounting surface of the substructure;
  b. calculating in the mating area of the skin a set of deviations greater than a design tolerance of the as-built thickness profile from the designed thickness profile;
  c. constructing a shim with an outline and profile matching the set of deviations in the mating area of the skin; and
  d. assembling the skin to the substructure with the shim installed therebetween.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

We claim:

1. A method for creating a shim for use in mounting a skin to a substructure, the skin defining an inner surface, an outer surface opposite the inner surface, and a skin thickness between the inner and outer surfaces, the substructure defining a mating surface for the skin, wherein a digital model associated with the skin includes a nominal map of the skin thickness, the shim to be configured to fill any gaps greater than a design allowance in a mating area between the inner surface of the skin and the substructure, the method comprising the steps of:
   a. nondestructively inspecting the skin at a plurality of locations of at least one of the inner and outer surfaces to gather a data set relating to the skin thickness;
   b. calculating, using the data set, a set of as-built thickness values for the skin for at least a portion of the plurality of locations;
   c. determining the mating area of the inner surface of the skin with the mating surface of the substructure; and
   d. generating a set of shim dimension data by calculating in the mating area of the inner surface of the skin a set of deviations greater than the design allowance of the set of as-built thickness values from the nominal map of the skin thickness.

2. The method of claim 1 further including a step of using the set of shim dimension data to construct the shim.

3. The method of claim 2 wherein the step of constructing the shim includes use of an additive manufacturing technique.

4. The method of claim 3 wherein the additive manufacturing technique includes printing the shim with a 3D printer.

5. The method of claim 1 wherein the skin and the substructure each include at least one pre-formed assembly hole aligned with one another and the step of generating the set of shim dimension data includes defining an assembly hole in the shim aligned with the pre-formed assembly holes of the skin and the substructure.

6. The method of claim 1 wherein each deviation includes a deviation value and a deviation location and further comprising a step of recording in a database the locations and values of the deviations greater than the design tolerance of the set of as-built thickness values from the nominal map of the skin thickness for use in subsequent production of another skin.

7. The method of claim 1 wherein the step of nondestructively inspecting the skin to gather the data set includes using ultrasound to inspect the skin.

8. The method of claim 1 wherein the step of determining the mating area of the skin with the substructure precedes the step of calculating the set of as-built thickness values for the skin, and further wherein the as-built thickness values of the skin are calculated only in the mating area of the skin.

9. A method for making a shim for use in mounting a first part to a second part, wherein at least one of the first part and the second part defines a first designed thickness profile, the method arranged to construct the shim with an outline and a profile customized to fill a gap greater than a design allowance between the first part and the second part, the method comprising the steps of:
   a. nondestructively inspecting at least one of the first part and the second part to gather a data set;
   b. calculating, using the data set, an as-built thickness profile of at least a portion of at least one of the first part and the second part;
   c. virtually overlaying the first part on the second part to determine a mating area of the first part with the second part;
   d. calculating in the mating area for at least one of the first part and the second part a set of deviations greater than a design allowance of the as-built thickness profile from the designed thickness profile; and
   e. constructing the shim to have the outline and profile to match the set of deviations in the mating area.

10. The method of claim 9 wherein the first part is a skin and the second part is a substructure and wherein the steps of nondestructively inspecting and calculating an as-built thickness profile include inspecting the skin and calculating an as-built thickness profile of the skin.

11. The method of claim 9 wherein the first part is a skin and the second part is a substructure and wherein the steps of nondestructively inspecting and calculatiung an as-built thickness profile include inspecting the substructure and calculating an as-built thickness profile of the substructure.

12. The method of claim 9 wherein the first part is a skin defining the first designed thickness profile and the second part is a substructure defining a second designed thickness profile and wherein the steps of nondestructively inspecting and calculating an as-built thickness profile include inspecting the skin and the substructure and calculating an as-built thickness profile of the skin and an as-built thickness profile of the substructure, and further wherein the step of calculating the set of deviations includes calculating the set of deviations for both the skin and the substructure.

13. The method of claim 9 wherein the first part and the second part each include at least one pre-formed assembly hole aligned with one another and the step of constructing the shim includes forming an assembly hole in the shim aligned with the pre-formed assembly holes of the first part and the second part.

14. The method of claim 9 further comprising a step of recording in a database the set of deviations of the as-built thickness profile from the designed thickness profile for use in subsequent production of another skin.

15. The method of claim 9 wherein the step of nondestructively inspecting at least one of the first part and the second part includes using ultrasound.

16. A system for creating a shim for use in assembling a first part defining a first mating surface to a second part defining a second mating surface, wherein a first digital model, including a first nominal map in two horizontal dimensions and in a thickness dimension, is associated with the first part, and wherein a second digital model, including a second nominal map in two horizontal dimensions, is associated with the second part, the shim to be configured with an outline and a profile customized to fill a gap greater than a design allowance between the mating surfaces of the first part and the second part, the system comprising:
   a. a nondestructive inspection system configured to inspect the first part to gather a data set relating to the first part;
   b. a computer coupled to the nondestructive inspection system and configured to receive the data set relating to the first part and to store the first nominal map of the first part, the second nominal map of the second part, and the design allowance, the computer including a processing element configured to calculate, from the data set relating to the first part, an as-built thickness profile for at least a portion of the first part, and to virtually overlay the first nominal map of the first part on the second nominal map of the second part to determine a mating area of the first part and the second part, and to generate in the mating area a set of shim dimension data by calculating a set of deviations greater than the design allowance of the as-built thickness profile of the first part from the nominal map of the first part.

17. The system of claim 16 further comprising an additive manufacturing device coupled to the computer to receive the shim dimension data, the additive manufacturing device configured to construct the shim.

18. The system of claim 16 wherein the digital model of at least one of the first part and the second part includes a model of a first pre-formed assembly hole, and wherein the computer generates the set of shim dimension data to include a model of a second pre-formed assembly hole aligned with the first pre-formed assembly hole.

19. The system of claim 16 wherein the nondestructive inspection system includes an ultrasound system.

20. The system of claim 16 wherein the computer records in a database the set of deviations of the as-built thickness profile of the first part from the nominal map of the first part for use in subsequent production of another first part.

\* \* \* \* \*